(12) United States Patent
Schell et al.

(10) Patent No.: US 8,760,209 B2
(45) Date of Patent: Jun. 24, 2014

(54) APPARATUS AND METHODS FOR QUADRATURE CLOCK SIGNAL GENERATION

(71) Applicant: Analog Devices, Inc., Norwood, MA (US)

(72) Inventors: Robert Schell, Chatham, NJ (US); John Kenney, West Windsor, NJ (US); Wei-Hung Chen, Millburn, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/629,170

(22) Filed: Sep. 27, 2012

(65) Prior Publication Data
US 2014/0086364 A1    Mar. 27, 2014

(51) Int. Cl.
*H03K 3/00*    (2006.01)
*H03H 11/16*   (2006.01)
*H03K 5/13*    (2006.01)

(52) U.S. Cl.
USPC ............................. 327/237; 327/238; 327/239

(58) Field of Classification Search
USPC ........................................ 327/237, 238, 239
See application file for complete search history.

(56) References Cited

U.S. PATENT DOCUMENTS 6,950,485 B2 * 9/2005 Richards et al. .............. 375/355

OTHER PUBLICATIONS

Kaukovuori, *Analysis and Design of Passive Polyphase Filters*, IEEE Transactions on Circuits and Systems, I: Regular Papers, vol. 55, No. 10, Nov. 2008, p. 3023-3037.

* cited by examiner

*Primary Examiner* — John Poos
(74) *Attorney, Agent, or Firm* — Knobbe Martens Olson & Bear LLP

(57) ABSTRACT

Apparatus and methods for quadrature clock signal generation are provided. In certain implementations, a quadrature clock signal generator includes a sine-shaping filter and a polyphase filter. The sine-shaping filter can receive an input clock signal such as a square or rectangular wave and can filter the input clock signal to generate a sinusoidal clock signal. Additionally, the polyphase filter can use the sinusoidal clock signal to generate in-phase (I) and quadrature-phase (Q) clock signals, which can have a phase difference of about ninety degrees. In certain configurations, the in-phase and quadrature-phase clock signals generated by the polyphase filter can be buffered by a buffer circuit to generate in-phase and quadrature-phase sinusoidal reference clock signals suitable for use in a clock and data recover (CDR) system.

21 Claims, 11 Drawing Sheets

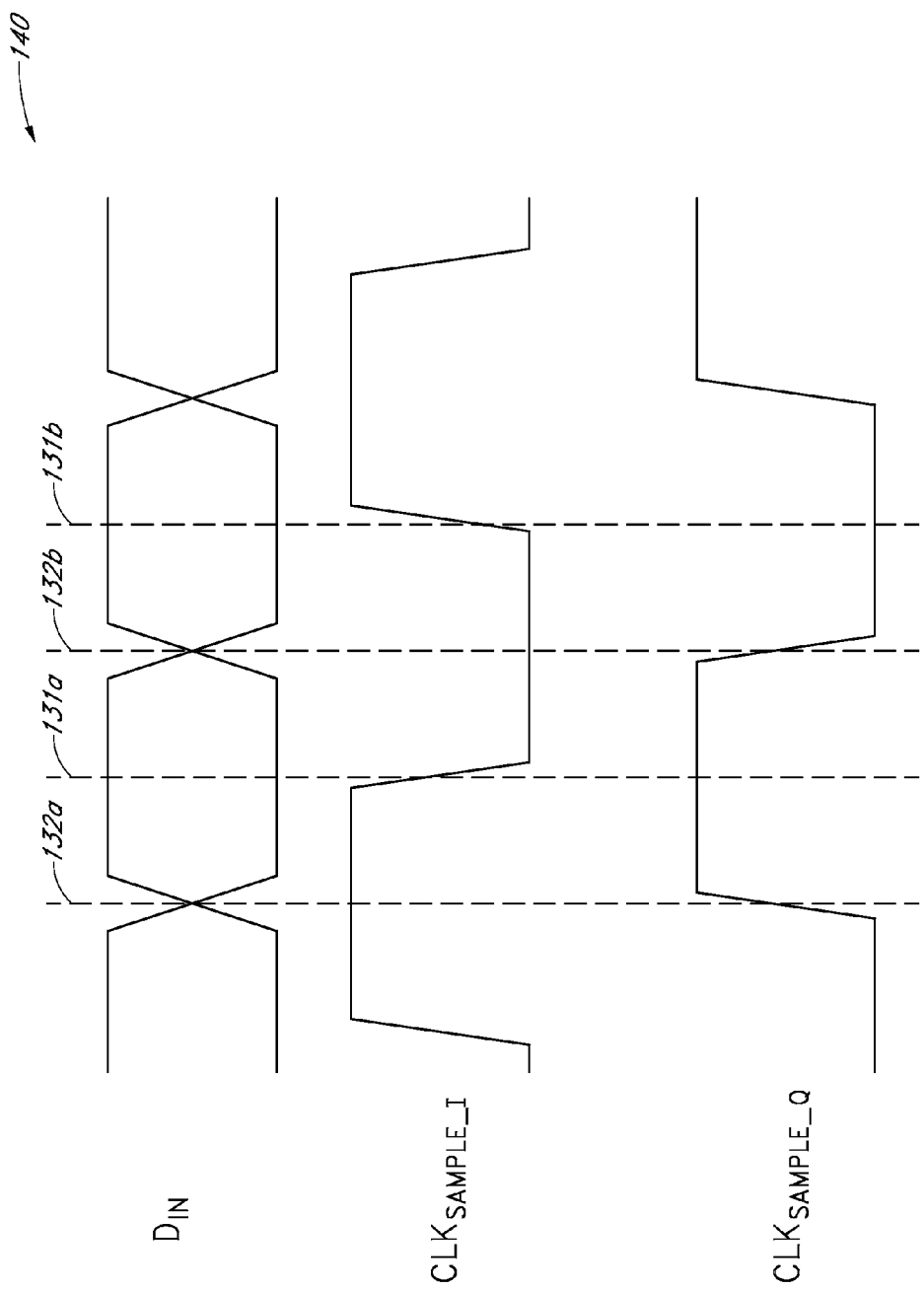

APPARATUS AND METHODS FOR QUADRATURE CLOCK SIGNAL GENERATION

BACKGROUND

1. Field

Embodiments of the invention relate to electronic devices, and more particularly, to quadrature clock signal generators.

2. Description of the Related Technology

Clock and data recovery (CDR) systems can be used in a variety of applications for recovering data from a high-speed serial data stream. CDR systems can be used in, for example, telecommunications systems, optical networks, and chip-to-chip communication.

A CDR system can use a sampling clock signal to capture samples from the serial data stream. The sampling clock signal can be generated in a variety of ways. For example, a CDR system can include a frequency synthesizer for generating a high speed clock signal having a frequency that is a multiple of a reference clock signal, and the CDR system can generate quadrature square wave clock signals from the high speed clock signal by using a quadrature divider. The quadrature square wave clock signals can be filtered to generate sine and cosine clock signals, which can be used to generate the sampling clock signal by weighted-based phase interpolation.

In certain applications, using a clock synthesizer and a quadrature divider to generate a sampling clock signal can be a practical method of quadrature clock signal generation. However, as data rates of CDR systems increase, the synthesizer and/or the quadrature divider can become more difficult to design, consume a relatively large amount of power, and/or occupy a relatively large die area. Additionally, for certain applications, such as radio transceiver applications, the high speed clock signal can generate undesirable coupling, pulling, and/or other forms of interference.

There is a need for CDR systems having improved performance. Additionally, there is need for improved systems and methods for quadrature clock signal generation.

SUMMARY

In one embodiment, an apparatus includes a sine-shaping filter and a polyphase filter. The sine-shaping filter is configured to receive a clock input signal and to filter the clock input signal to generate a sinusoidal clock signal, and the polyphase filter is configured to receive the sinusoidal clock signal and to generate an in-phase clock signal and a quadrature-phase clock signal based on the sinusoidal clock signal. The in-phase clock signal and the quadrature-phase clock signal have a quadrature phase relationship.

In another embodiment, a method of clock signal generation includes filtering a clock input signal to generate a sinusoidal clock signal using a sine-shaping filter, and generating an in-phase clock signal and a quadrature-phase clock signal from the sinusoidal clock signal using a polyphase filter. The in-phase sinusoidal reference clock signal and the quadrature-phase sinusoidal reference clock signal have a quadrature phase relationship.

In another embodiment, an apparatus includes a means for sine-shaping configured to receive a clock input signal and to filter the clock input signal to generate a sinusoidal clock signal, a means for polyphase filtering configured to receive the sinusoidal clock signal and to generate an in-phase clock signal and a quadrature-phase clock signal based on the sinusoidal clock signal, and a means for buffering configured to buffer the in-phase clock signal to generate an in-phase sinusoidal reference clock signal and to buffer the quadrature-phase clock signal to generate a quadrature-phase sinusoidal reference clock signal. The in-phase sinusoidal reference clock signal and the quadrature-phase sinusoidal reference clock signal have a quadrature phase relationship.

BRIEF DESCRIPTION OF THE DRAWINGS

FIG. 8B is a graph illustrating one example of a timing diagram for the CDR system of FIG. 8A.

DETAILED DESCRIPTION OF EMBODIMENTS

Figure 1A:
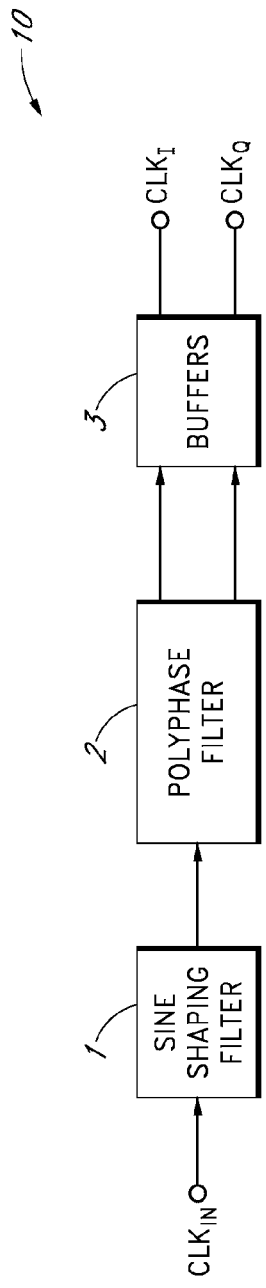
FIG. 1A is a schematic block diagram illustrating one embodiment of a quadrature clock signal generator.

The following detailed description of embodiments presents various descriptions of specific embodiments of the invention. However, the invention can be embodied in a multitude of different ways as defined and covered by the claims. In this description, reference is made to the drawings where like reference numerals indicate identical or functionally similar elements.

Apparatus and methods for quadrature clock signal generation are provided. In certain implementations, a quadrature clock signal generator includes a sine-shaping filter and a polyphase filter. The sine-shaping filter can receive an input clock signal such as a square or rectangular wave clock signal and can filter the input clock signal to generate a sinusoidal clock signal. Additionally, the polyphase filter can use the sinusoidal clock signal to generate in-phase (I) and quadrature-phase (Q) clock signals, which can have a quadrature phase relationship. As used herein, clock signals having a quadrature phase relationship can refer to clock signals having an equal period and a phase difference that is about one-quarter of the clock signals' period or about 90°. In certain configurations, the in-phase and quadrature-phase clock signals generated by the polyphase filter can be buffered by a buffer circuit to further generate reference clock signals suitable for use in a clock and data recover (CDR) system.

By cascading the sine-shaping filter and the polyphase filter, quadrature sinusoidal reference clock signals can be generated from a input clock signal, such as a square or rectangular wave clock signal. Thus, a CDR system including the quadrature clock signal generator can receive, for example, a single-phase at-rate square wave clock signal that can be used to generate in-phase and quadrature-phase sinusoidal reference clock signals from which a sampling clock signal can be generated. Thus, the quadrature clock signal generators described herein can advantageously be used in a CDR system to provide quadrature sinusoidal reference clock signals without needing to use a frequency synthesizer and a quadrature divider.

FIG. 1A is a schematic block diagram illustrating one embodiment of a quadrature clock signal generator 10. The quadrature clock signal generator 10 includes a sine-shaping filter 1, a polyphase filter 2, and a buffer circuit or buffers 3. The quadrature clock signal generator 10 further includes a clock input terminal $CLK_{IN}$, an in-phase clock output terminal $CLK_I$, and a quadrature-phase clock output terminal $CLK_Q$.

The quadrature clock signal generator 10 can be used to generate sinusoidal reference clock signals that are in a quadrature phase relationship, such as a sine clock signal and a cosine clock signal. For example, the quadrature clock signal generator 10 can generate a cosine reference clock signal on the in-phase clock output terminal $CLK_I$ and a sine reference clock signal on the quadrature-phase clock output terminal $CLK_Q$. Although the clock input terminal $CLK_{IN}$, the in-phase clock output terminal $CLK_I$, and the quadrature-phase clock output terminal $CLK_Q$ are illustrated in FIG. 1A in a single-ended configuration, the teachings herein are applicable to both singled-ended and differential configurations.

The sine-shaping filter 1 can be used to remove frequency harmonics of an input clock signal received on the clock input terminal $CLK_{IN}$. The input clock signal can be a square wave clock signal, a rectangular wave clock signal, or any other suitable periodic waveform having a fundamental frequency at a desired output clock signal frequency. Since a periodic waveform can be represented by a Fourier series of sine waves at a fundamental frequency and at harmonics thereof, the sine-shaping filter 1 can be used to filter out high frequency components of the input clock signal to generate a sinusoidal clock signal. Shaping the input clock signal using the sine-shaping filter 1 can also aid in reducing the input clock signal's duty cycle distortion by filtering out undesirable even-order harmonics. Although the sine-shaping filter 1 is described as generating a sinusoidal clock signal, the sinusoidal clock signal need not be a perfect sinusoid. In one embodiment, the generated sinusoidal clock signal can have up to about 2% total harmonic distortion. In addition, other signals described herein as "sinusoidal" also do not need to be perfect sine waves and can have similar amounts of distortion.

The polyphase filter 2 can receive the sinusoidal clock signal from the sine-shaping filter 1, and can generate in-phase and quadrature-phase clocks signals from the sinusoidal clock signal. As used herein, a polyphase filter can refer to an analog filter that generates quadrature output clock signals in response to a sinusoidal input clock signal. For example, the polyphase filter's transfer function can have one or more poles including a first pole located at a first frequency, and the polyphase filter can generate quadrature output clock signals of about equal amplitude in response to an input sinusoidal clock signal of the first frequency.

As will be described in detail further below with respect to FIGS. 3A-6, the polyphase filter 2 can include one or more stages of resistors and capacitors implemented to control the location in frequency of one or more poles of the polyphase filter's transfer function. For example, each stage of the polyphase filter 2 can be associated with a corresponding transfer function pole, and the frequency of a particular stage's pole can be controlled based on a resistor-capacitor (RC) time constant associated with the stage.

In certain implementations, the polyphase filter 2 can be a type-I polyphase filter configured to generate quadrature output clock signals in response to sinusoidal input clock signals of a wide range of frequencies, but the amplitude of the in-phase and quadrature-phase clock signals can be equal when the sinusoidal input clock signal's frequency is near or close to a frequency of one of the polyphase filter's poles. In other implementations, the polyphase filter 2 can be a type-II polyphase filter configured to generate output clock signals having about equal amplitude in response to sinusoidal input clock signals of a wide range of frequencies, but the phase difference between the output clock signals can be in a quadrature phase relationship when the sinusoidal input clock signal's frequency is near a frequency of one of the polyphase filter's poles.

The resistors and capacitors used in the polyphase filter 2 can be passive components. For example, in certain implementations the resistors can be formed using polysilicon and the capacitors can be formed using metal-oxide-metal (MOM) and/or metal-insulator-metal (MIM) capacitors. However, other configurations of the resistors and/or capacitors can be used, including, for example, implementations using active components, such as transistors.

The buffers 3 can be used to buffer the in-phase and quadrature-phase clock signals generated by the polyphase filter 2 to generate in-phase and quadrature-phase sinusoidal reference clock signals suitable for driving load circuitry. For example, the buffers 3 can include non-inverting or inverting amplification circuitry configured to buffer the in-phase and quadrature-phase clock signals generated by the polyphase filter 2 to generate an in-phase sinusoidal reference clock signal on the in-phase clock output terminal $CLK_I$ and a quadrature-phase sinusoidal reference clock signal on the quadrature-phase clock output terminal $CLK_Q$.

Although the buffers 3 can be configured to have a relatively low gain, such as a gain in the range of about 0.8 to about 2, the buffers 3 can be used to restore a signal level of the in-phase and quadrature-phase clock signals associated with losses of the polyphase filter 2. For example, the polyphase filter 2 can include passive elements, which can cause attenuation in the amplitude of the in-phase and quadrature-phase clock signals generated by the polyphase filter 2 relative to the amplitude of the sinusoidal clock signal received by the polyphase filter 2.

The quadrature clock signal generator 10 can be used to provide quadrature sinusoidal reference clock signals to load circuitry. In certain implementations, the quadrature clock signal generator 10 is included in a CDR system and is used to provide in-phase and quadrature-phase sinusoidal reference clock signals to a phase interpolator. As will be described in detail further below with reference to FIGS. 7A-8B, the phase interpolator can be used to generate a sampling clock signal based on a weighted sum of the in-phase and quadrature-phase sinusoidal reference clock signals.

Figure 1B:
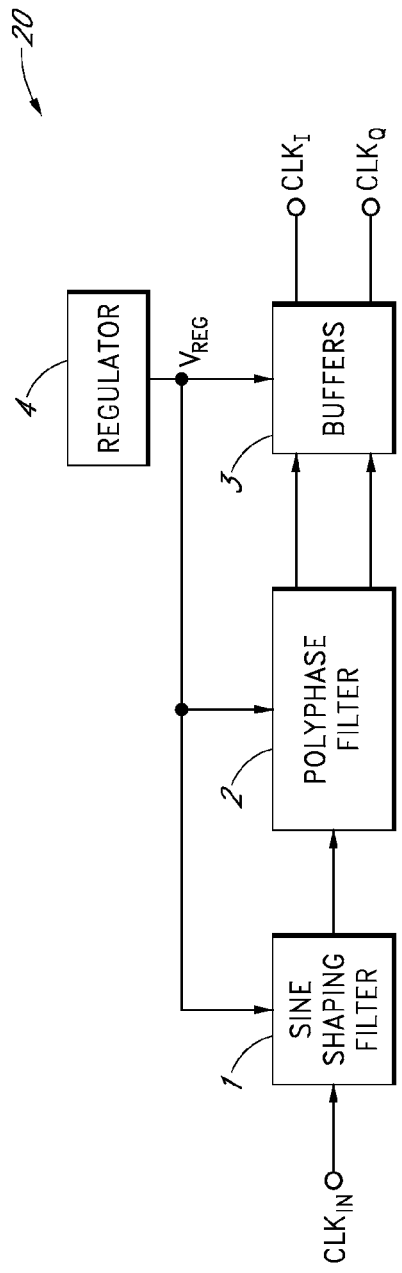
FIG. 1B is a schematic block diagram illustrating another embodiment of a quadrature clock signal generator.

FIG. 1B is a schematic block diagram illustrating another embodiment of a quadrature clock signal generator 20. The quadrature clock signal generator 20 includes the sine-shaping filter 1, the polyphase filter 2, the buffers 3, the clock input terminal $CLK_{IN}$, the in-phase clock output terminal $CLK_I$, the quadrature-phase clock output terminal $CLK_Q$, and a regulator 4.

The quadrature clock signal generator 20 of FIG. 1B is similar to the quadrature clock signal generator 10 of FIG. 1A, except that the quadrature clock signal generator 20 of FIG. 1B further includes the regulator 4. As shown in FIG. 1B, the regulator 4 can be used to generate a regulated voltage $V_{REG}$, which has been used to power the buffers 3 at least in part. Additionally, as shown in FIG. 1B, the regulator 4 can be used to power all or part of the sine-shaping filter 1 and/or the polyphase filter 2. Including the regulator 4 can aid in controlling the amplitude of the in-phase and quadrature-phase sinusoidal reference clock signals generated on the in-phase and quadrature-phase clock output terminals $CLK_I$, $CLK_Q$, respectively. Enhanced control over the amplitudes of the in-phase and quadrature-phase sinusoidal reference clock signals can aid in reducing error in an interpolated sinusoidal clock signal generated based on a weighted sum of the in-phase and quadrature-phase sinusoidal reference clock signals.

The regulator 4 can be any suitable regulator, including, for example, a low-dropout (LDO) regulator. Although the regulator 4 is illustrated in FIG. 1B as powering the sine-shaping filter 1, the polyphase filter 2, and the buffers 3, other configurations are possible, such as implementations in which the regulator 4 powers only the buffers 3.

Quadrature clock signal generators, such as the quadrature clock signal generators 10, 20 of FIGS. 1A-1B, can be referred to herein as sine-shaping polyphase filters (SSPPFs).

Figure 2:
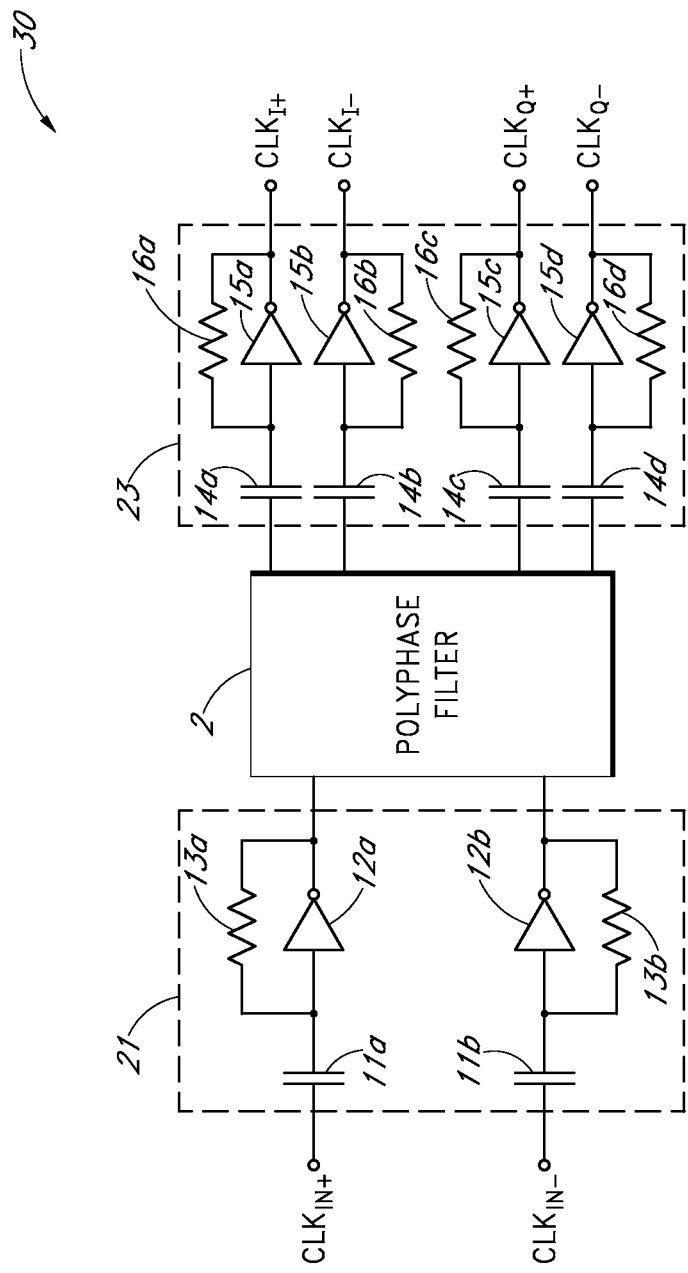
FIG. 2 is a circuit diagram illustrating one embodiment of a quadrature clock signal generator.

FIG. 2 is a circuit diagram illustrating one embodiment of a quadrature clock signal generator 30. The quadrature clock signal generator 30 includes a sine-shaping filter 21, the polyphase filter 2, and a buffer circuit or buffers 23. The quadrature clock signal generator 30 further includes a first or non-inverting clock input terminal $CLK_{IN+}$, a second or inverting clock input terminal $CLK_{IN-}$, a first or non-inverting in-phase clock output terminal $CLK_{I+}$, a second or inverting in-phase clock output terminal $CLK_{I-}$, a first or non-inverting quadrature-phase clock output terminal $CLK_{Q+}$, and a second or inverting quadrature-phase clock output terminal $CLK_{Q-}$. The quadrature clock signal generator 30 illustrates one implementation of a differential quadrature clock signal generator in accordance with the teachings herein.

The quadrature clock signal generator 30 is configured to receive a differential input clock signal, such as a square or rectangular wave clock signal between the non-inverting and inverting clock input terminals $CLK_{IN+}$, $CLK_{IN-}$. Additionally, the quadrature clock signal generator 30 is configured to generate a differential in-phase sinusoidal reference clock signal between the non-inverting and inverting in-phase clock output terminals $CLK_{I+}$, $CLK_{I-}$ and to generate a differential quadrature-phase sinusoidal reference clock signal between the non-inverting and inverting quadrature-phase clock output terminals $CLK_{Q+}$, $CLK_{Q-}$.

The sine-shaping filter 21 includes first and second capacitors 11a, 11b, first and second inverters 12a, 12b, and first and second resistors 13a, 13b. The first resistor 13a is electrically connected between an input and an output of the first inverter 12a, and the second resistor 13b is electrically connected between an input and an output of the second inverter 12b. The first capacitor 11a is electrically connected between the non-inverting clock input terminal $CLK_{IN+}$ and the input of the first inverter 12a, and the second capacitor 11b is electrically connected between the inverting clock input terminal $CLK_{IN-}$ and the input of the second inverter 12b. The sine-shaping filter 21 is configured to generate a differential sinusoidal clock signal for the polyphase filter 2 between the outputs of the first and second inverters 12a, 12b.

The sine-shaping filter 21 can be used to filter the differential clock signal received between the non-inverting and inverting clock input terminals $CLK_{IN+}$, $CLK_{IN-}$. For example, frequency roll-off of the first and second inverters 12a, 12b associated with output loading, including loading of the polyphase filter 2, can filter out high frequency components of the differential input clock signal, such as second and third harmonic frequency components. Since a square or rectangular wave signal can be represented by a Fourier series of sine waves at the wave signal's fundamental frequency and at harmonics thereof, filtering the differential input clock signal in this manner can aid in generating a differential sinusoidal clock signal using the sine-shaping filter 21.

The polyphase filter 2 can use the differential sinusoidal clock signal from the sine-shaping filter 21 to generate a differential in-phase clock signal and a differential quadrature-phase clock signal for the buffers 23. Since a theory of operation of the polyphase filter 2 can be based on receiving an input sinusoidal clock signal, using the sine-shaping filter 21 to generate the differential sinusoidal clock signal for the polyphase filter 2 can enhance the spectral purity of the in-phase and quadrature-phase clock signals generated by the polyphase filter 2. Various embodiments of the polyphase filter 2 will be described further below with reference to FIGS. 3A-6.

The buffers 23 include first to fourth capacitors 14a-14d, first to fourth inverters 15a-15d, and first to fourth resistors 16a-16d. The first resistor 16a is electrically connected between an input and an output of the first inverter 15a, and the second resistor 16b is electrically connected between an input and an output of the second inverter 15b. Similarly, the third resistor 16c is electrically connected between an input and an output of the third inverter 15c, and the fourth resistor 16d is electrically connected between an input and an output of the fourth inverter 15d. The first and second capacitors 14a, 14b are disposed in a path between the differential in-phase clock signal generated by the polyphase filter 2 and the inputs of the first and second inverters 15a, 15b, respectively. Additionally, the third and fourth capacitors 14c, 14d are disposed in a path between the differential quadrature-phase clock signal generated by the polyphase filter 2 and the inputs of the third and fourth inverters 15c, 15d, respectively. The outputs of the first and second inverters 15a, 15b are configured to generate the differential in-phase sinusoidal reference clock signal between the non-inverting and inverting in-phase clock output terminals $CLK_{I+}$, $CLK_{I-}$, and the outputs of the third and fourth inverters 15c, 15d are configured to generate the differential quadrature-phase sinusoidal reference clock signal between the non-inverting and inverting quadrature-phase clock output terminals $CLK_{Q+}$, $CLK_{Q-}$.

The buffers 23 can be used to buffer the differential in-phase and quadrature-phase clock signals generated by the polyphase filter 2 to aid in providing quadrature sinusoidal reference clock signals to load circuitry, such as a phase interpolator of a CDR system. The buffers 23 can aid in compensating for attenuation or loss associated with generating the in-phase and quadrature-phase clock signals using the polyphase filter 2. Although not illustrated in FIG. 2, in certain implementations the first to fourth inverters 15a-15d can include voltage supplies regulated to provide a desired output voltage level of the quadrature sinusoidal reference clock signals. Additionally, in certain implementations, separate regulators are provided for powering the first and second inverters 15a, 15b and the third and fourth inverters 15c, 15d so as to compensate for different attenuations in the in-phase and quadrature-phase clock signal paths of the polyphase filter 2. Additionally, the separate regulators can be used to provide unequal amplitudes for the in-phase and quadrature-phase clock signals when using certain phase interpolation schemes.

The illustrated buffers 23 can also aid in filtering the differential in-phase and quadrature-phase clock signals generated by the polyphase filter 2 by operating as a low pass filter that removes undesirable output harmonic frequency components. Thus, in certain implementations, the buffers 23 can also provide additional sine-shaping or filtering so as to provide in-phase and quadrature-phase sinusoidal reference clock signals having enhanced spectral purity.

Although FIG. 2 illustrates one configuration of the sine-shaping filter 21 and the buffers 23 suitable for use in the quadrature clock signal generators described herein, other implementations of sine-shaping filters and/or buffers can be used, including, for example, inverting, non-inverting, and/or multi-stage configurations.

Figure 3A:
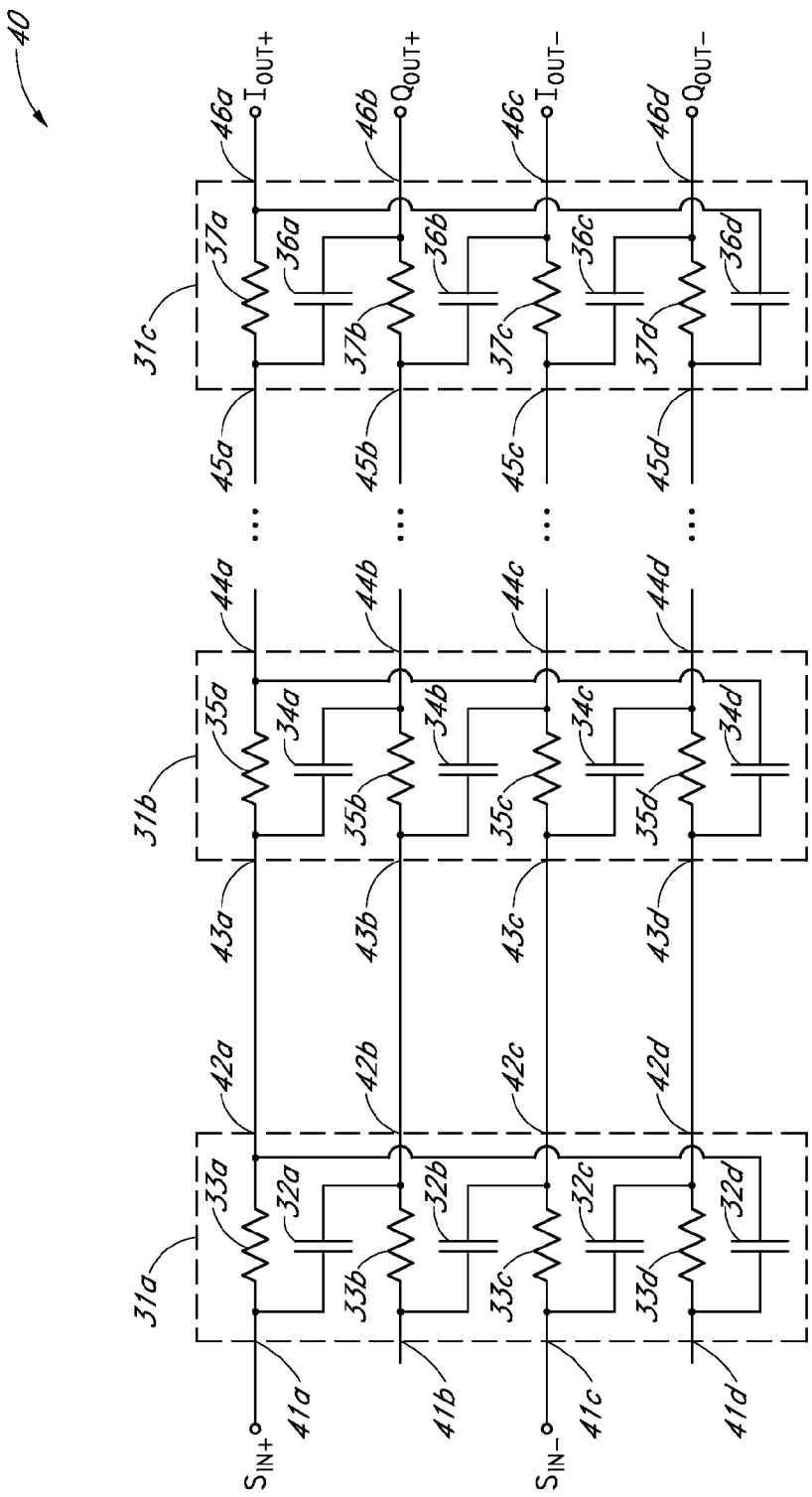
FIG. 3A is a circuit diagram illustrating one embodiment of a polyphase filter.

FIG. 3A is a circuit diagram illustrating one embodiment of a polyphase filter 40. The polyphase filter 40 includes a first stage 31a, a second stage 31b, and a third stage 31c. The polyphase filter 40 further includes a non-inverting clock input terminal $S_{IN+}$, an inverting clock input terminal $S_{IN-}$, a non-inverting in-phase clock output terminal $I_{OUT+}$, an inverting in-phase clock output terminal $I_{OUT-}$, a non-inverting quadrature-phase clock output terminal $Q_{OUT+}$, and an inverting quadrature-phase clock output terminal $Q_{OUT-}$.

The polyphase filter 40 can receive a differential input clock signal between the non-inverting and inverting clock input terminals $S_{IN+}$, $S_{IN-}$. Additionally, the polyphase filter 40 can generate a differential in-phase clock signal between the non-inverting and inverting in-phase clock output terminals $I_{OUT+}$, $I_{OUT-}$ and a differential quadrature-phase clock signal between the non-inverting and inverting quadrature-phase clock output terminals $Q_{OUT+}$, $Q_{OUT-}$.

Although FIG. 3A illustrates a configuration using three stages, the polyphase filter 40 can be adapted to include more or fewer stages in alternative embodiments. Configuring the polyphase filter 40 to include additional stages can increase a number of poles in the transfer function of the polyphase filter, which can aid in generating quadrature clock signals over a wider range of input clock signal frequencies. Configuring a quadrature clock signal generator to operate over a wide range of input clock signal frequencies can be useful, for example, in CDR systems that use a sampling clock signal that operates across multiple decades of frequency. However, including a large number of stages in the polyphase filter 2 can also increase the polyphase filter's loss absent an attenuation-compensation scheme, such as inter-stage buffering.

The first to third stages 31a-31c each include first to fourth inputs and first to fourth outputs. The first and third inputs 41a, 41c of the first stage 31a are electrically connected to the non-inverting and inverting clock input terminal $S_{IN+}$, $S_{IN-}$, respectively. In the illustrated configuration, the second and fourth inputs 41b, 41d of the first stage 31a are unconnected to circuitry external to the first stage 31a. Additionally, the first to fourth outputs 42a-42d of the first stage 31a are electrically connected to the first to fourth inputs 43a-43d of the second stage 31b, respectively, and the first to fourth outputs 44a-44d of the second stage 31b are electrically connected to the first to fourth inputs 45a-45d of the third stage 31c, respectively. Furthermore, the first and third outputs 46a, 46c of the third stage 31c are electrically connected to the non-inverting and inverting in-phase clock output terminals $I_{OUT+}$, $I_{OUT-}$, respectively, and the second and fourth outputs 46b, 46d of the third stage 31c are electrically connected to the non-inverting and inverting quadrature-phase clock output terminals $Q_{OUT+}$, $Q_{OUT-}$, respectively.

The first stage 31a includes first to fourth resistors 33a-33d and first to fourth capacitors 32a-32d. The first resistor 33a is electrically connected between the first input 41a and the first output 42a of the first stage 31a, and the second resistor 33b is electrically connected between the second input 41b and the second output 42b of the first stage 31a. Additionally, the third resistor 33c is electrically connected between the third input 41c and the third output 42c of the first stage 31a, and the fourth resistor 33d is electrically connected between the fourth input 41d and the fourth output 42d of the first stage 31a. Furthermore, the first capacitor 32a is electrically connected between the first input 41a and the second output 42b of the first stage 31a, and the second capacitor 32b is electrically connected between the second input 41b and the third output 42c of the first stage 31a. Additionally, the third capacitor 32c is electrically connected between the third input 41c and the fourth output 42d of the first stage 31a, and the fourth capacitor 32d is electrically connected between the fourth input 41d and the first output 42a of the first stage 31a. The second stage 31b includes first to fourth resistors 35a-35d and first to fourth capacitors 34a-34d, which can be connected in a manner similar to that described above for the first stage 31a. Likewise, the third stage 31c includes first to fourth resistors 37a-37d and first to fourth capacitors 36a-36d, which can be connected in a manner similar to that described above for the first stage 31a.

In certain implementations, the resistors and the capacitors of the first to third stages 31a-31c can be passive components. For example, the resistors can be formed using resistive materials such as polysilicon or thin films geometrically sized to achieve a target resistance, while the capacitors can be formed using conductor-dielectric-conductor structures such as MOM or MIM capacitors. However, other configurations of the resistors and/or capacitors can be used, such as implementations using active transconductance ($g_m$) elements.

The first to third stages 31a-31c of the polyphase filter 40 can each add a pole to the transfer function of the polyphase filter 40. Thus, by choosing a number of stages of the polyphase filter 40, a desired number of poles in the polyphase filter's transfer function can be achieved. For example, the polyphase filter 40 can have a first pole located at a frequency associated with a RC time constant of the resistors and capacitors of the first stage 31a. For example, in a configuration in which the first to fourth resistors 33a-33d each have a resistance $R_{33}$ and the first to fourth capacitors 32a-32d each have a capacitance $C_{32}$, the polyphase filter 40 can have a first pole located at an angular frequency of about $1/(R_{33}*C_{32})$. Similarly, the polyphase filter 40 can have a second pole located at a frequency associated with a RC time constant of the resistors and capacitors of the second stage 31b and a third pole located at a frequency associated with a RC time constant of the resistors and capacitors of the third stage 31c.

The illustrated polyphase filter 40 is a type-I polyphase filter that can generate quadrature output clock signals in response to sinusoidal input clock signals of a wide range of input clock signal frequencies. For example, the differential in-phase and quadrature-phase clock signals generated by the polyphase filter 40 can have a quadrature phase relationship even when the sinusoidal input clock signal does not have a frequency close to or near the frequency of one of the polyphase filter's poles. However, the amplitudes of the differential in-phase and quadrature-phase clock signals can be different when the input signal clock frequency is not near one of the polyphase filter's poles. In certain implementations, the locations in frequency of the poles of the polyphase filter 40 are selected to cover or span an input frequency operating range of a quadrature clock signal generator such that a difference in amplitude between the differential in-phase and quadrature-phase clock signals can be relatively small across the input frequency operating range.

Figure 3B:
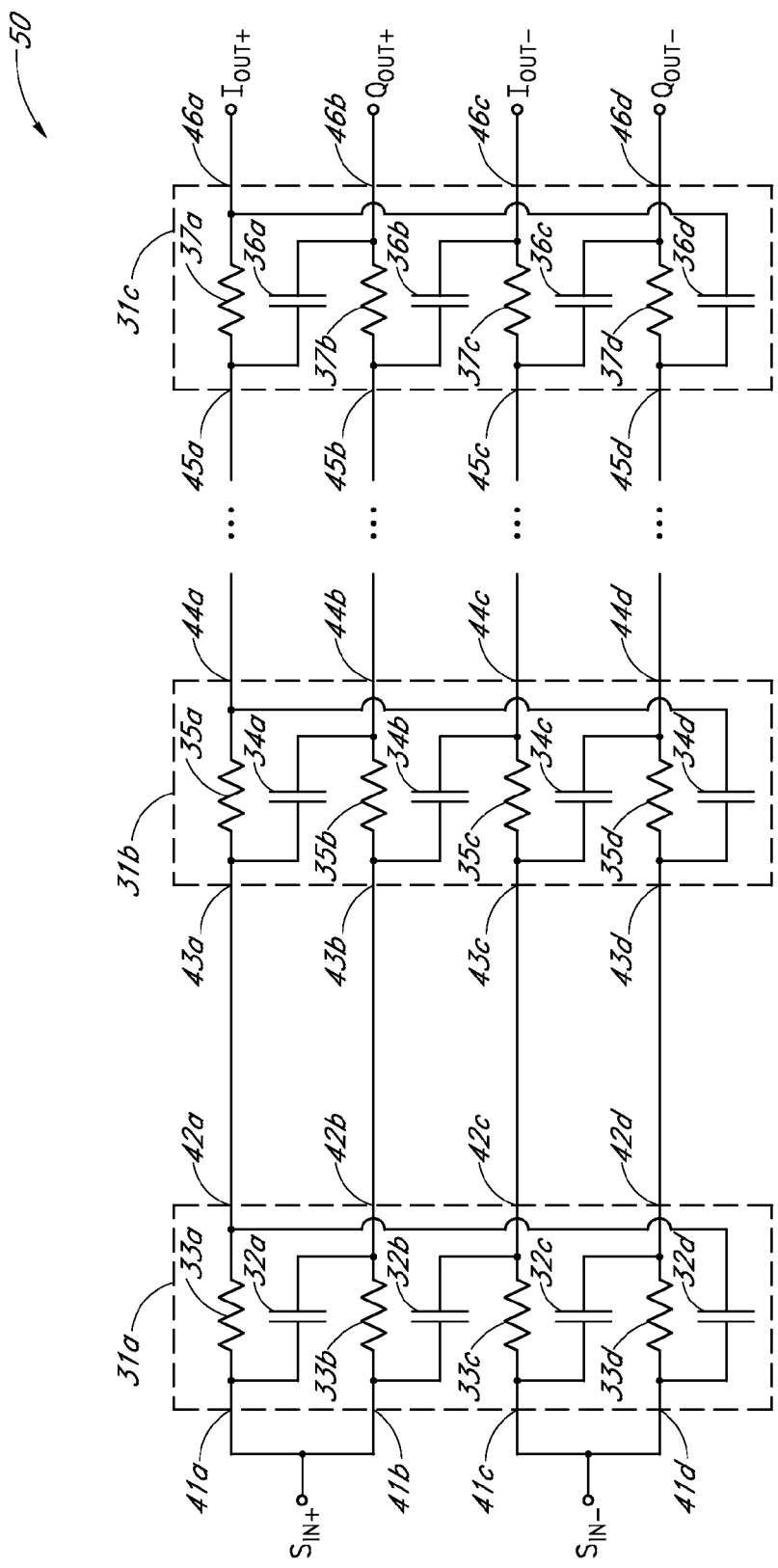
FIG. 3B is a circuit diagram illustrating another embodiment of a polyphase filter.

FIG. 3B is a circuit diagram illustrating another embodiment of a polyphase filter 50. The polyphase filter 50 includes the first to third stages 31a-31c, the non-inverting and inverting clock input terminals $S_{IN+}$, $S_{IN-}$, the non-inverting and inverting in-phase clock output terminals $I_{OUT+}$, $I_{OUT-}$, and the non-inverting and inverting quadrature-phase clock output terminals $Q_{OUT+}$, $Q_{OUT-}$.

The polyphase filter 50 of FIG. 3B is similar to the polyphase filter 40 of FIG. 3A, except that the inputs of the first stage 31a of the polyphase filter 50 have been connected in a different configuration relative to the inputs of the first stage 31a of the polyphase filter 40. For example, in FIG. 3B the first and second inputs 41a, 41b of the first stage 31a are electrically connected to the non-inverting clock input terminal $S_{IN+}$ and the third and fourth inputs 41c, 41d of the first stage 31a are electrically connected to the inverting clock input terminal $S_{IN-}$.

The polyphase filter 50 of FIG. 3B is a type-II polyphase filter that can generate output clock signals of about equal amplitude in response to sinusoidal input clock signals of a wide range of input clock signal frequencies. However, to ensure a quadrature phase relationship between the output clock signals, the input signal frequency should be near one of the polyphase filter's poles. In certain implementations, the locations in frequency of the poles of the polyphase filter 50 are selected to cover or span an input frequency operating range of a quadrature clock signal generator such that a difference in phase between the differential in-phase and quadrature-phase clock signals is about equal to 90° across the input frequency operating range.

Figure 4:
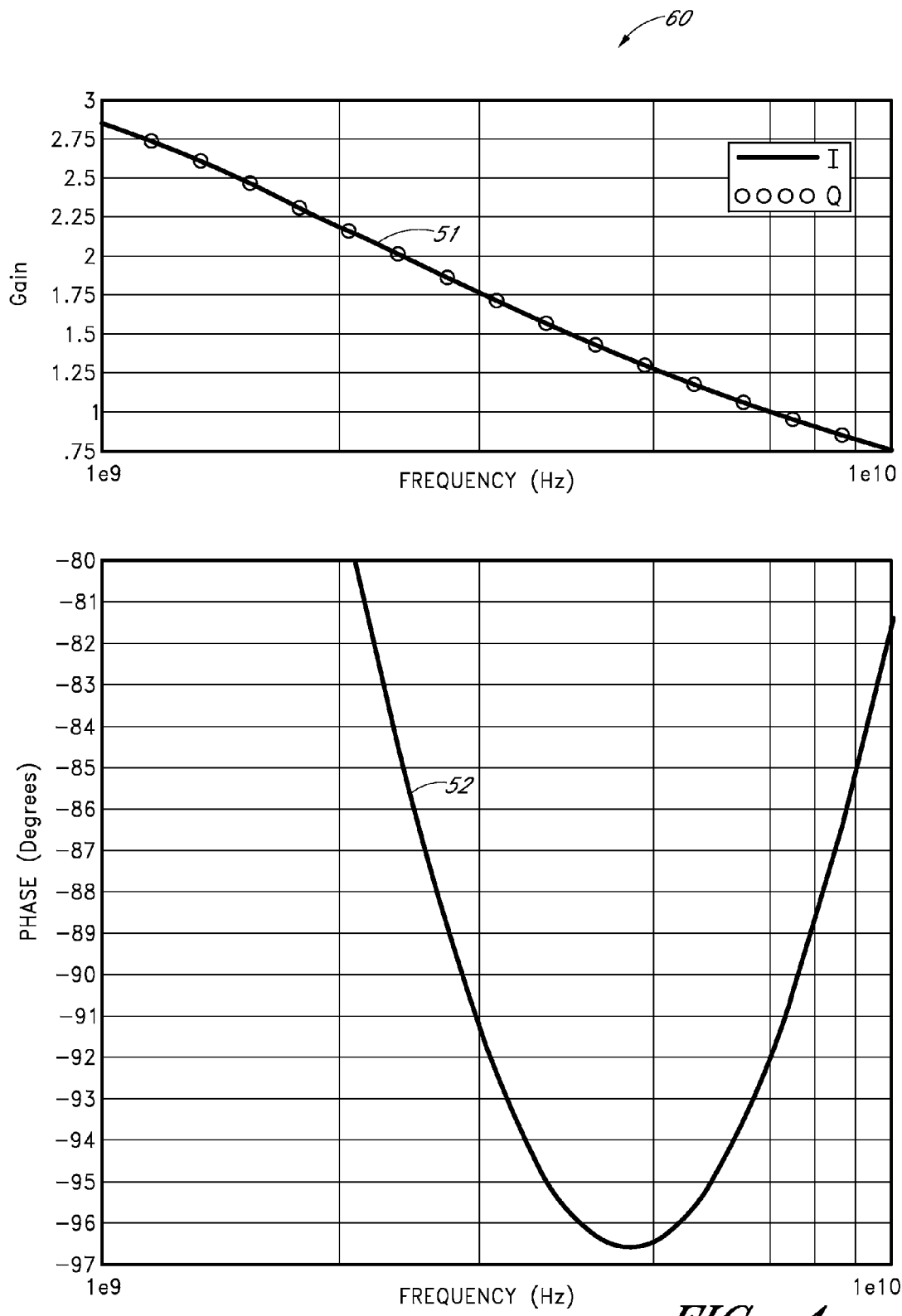
FIG. 4 is a graph illustrating one example of gain and phase versus frequency for a polyphase filter.

FIG. 4 is a graph 60 illustrating one example of gain and phase versus frequency for a polyphase filter. The graph 60 includes a gain plot 51 and a phase plot 52 for one implementation of the polyphase filter of FIG. 3B having two stages with corresponding poles at about 3 GHz and about 7.7 GHz, respectively. The gain plot 51 illustrates gain of in-phase and quadrature-phase clock signals and the phase plot 52 corresponds to a difference in phase between the in-phase and quadrature-phase clock signals. As shown in the FIG. 4, the polyphase filter can provide a relatively equal gain to both in-phase and quadrature-phase paths, and a phase within about +/−10% of 90° for input sinusoidal clock signals spanning a targeted operating frequency band between about 3.6 GHz and about 6.2 GHz.

Figure 5:
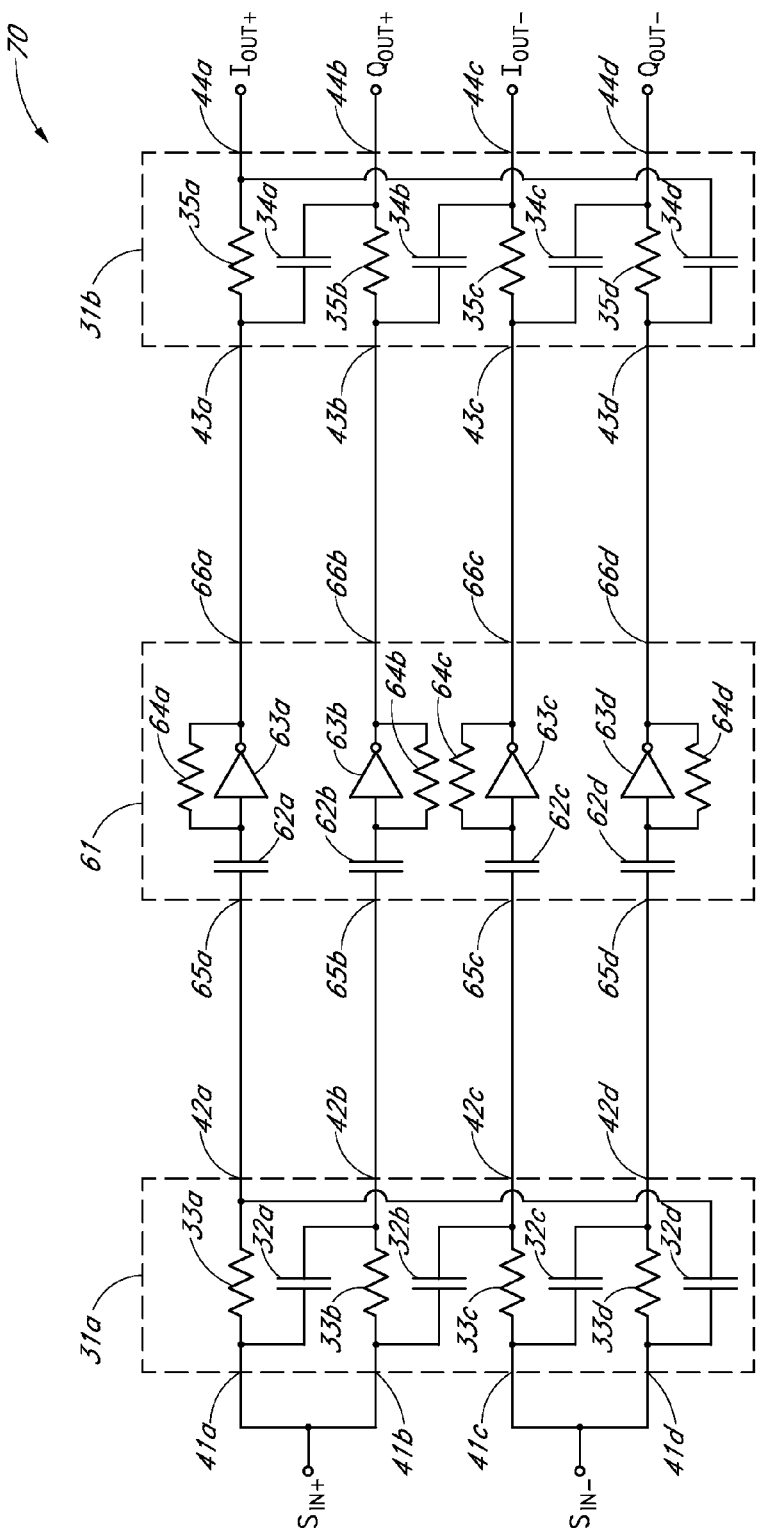
FIG. 5 is a circuit diagram illustrating another embodiment of a polyphase filter.

FIG. 5 is a circuit diagram illustrating another embodiment of a polyphase filter 70. The polyphase filter 70 includes the first and second stages 31a, 31b, the non-inverting and inverting clock input terminals $S_{IN+}$, $S_{IN-}$, the non-inverting and inverting in-phase clock output terminals $I_{OUT+}$, $I_{OUT-}$, the non-inverting and inverting quadrature-phase clock output terminals $Q_{OUT+}$, $Q_{OUT-}$, and inter-stage buffers 61.

The polyphase filter 70 of FIG. 5 is similar to the polyphase filter 50 of FIG. 3B, except that the polyphase filter 70 of FIG. 5 illustrates a two-stage configuration omitting the third stage 31c. Additionally, the polyphase filter 70 further includes the inter-stage buffer circuit or buffers 61.

The inter-stage buffer circuit 61 operates as a buffer between the first to fourth outputs 42a-42d of the first stage 31a and the first to fourth inputs 43a-43d of the second stage 31b. The inter-stage buffer circuit 61 includes first to fourth inputs 65a-65d electrically connected to the first to fourth outputs 42a-42d of the first stage 31a, respectively, and first to fourth outputs 66a-66d electrically connected to the first to fourth inputs 43a-43d of the second stage 31b, respectively. Additionally, the inter-stage buffer circuit 61 further includes first to fourth capacitors 62a-62d, first to fourth inverters 63a-63d and first to fourth resistors 64a-64d. The first resistor 64a is electrically connected between an input and an output of the first inverter 63a, and the second resistor 64b is electrically connected between an input and an output of the second inverter 63b. Similarly, the third resistor 64c is electrically connected between an input and an output of the third inverter 63c, and the fourth resistor 64d is electrically connected between an input and an output of the fourth inverter 63d. The first to fourth capacitors 62a-62d are electrically connected between the first to fourth inputs 65a-65d of the inter-stage buffer circuit 61 and the inputs of the first to fourth inverters 63a-63d, respectively. The outputs of the first to fourth inverters 63a-63d operate as the first to fourth outputs 66a-66d of the inter-stage buffer circuit 61, respectively.

The inter-stage buffer circuit 61 can be used to buffer signals generated by the first stage 31a and to provide the buffered signals to the second stage 31b. The inter-stage buffer circuit 61 can compensate for attenuation or loss associated with the first stage 31a. The inter-stage buffer circuit 61 can also aid in enhancing the filtering of the polyphase filter and/or achieving output swing requirements. Although not illustrated in FIG. 5, in certain implementations the first to fourth inverters 63a-63d can include voltage supplies regulated to provide a desired output voltage level.

Although FIG. 5 illustrates one configuration of inter-stage buffers, other implementations can be used, including, for example, inverting, non-inverting, and/or multi-stage configurations. Additionally, although FIG. 5 illustrates a polyphase filter including two stages with inter-stage buffers between the two stages, additional inter-stage buffers can be used for configurations including more stages. For example, when using a configuration with three of more stages, inter-stage buffers can be used between all or some of the stages.

Figure 6:
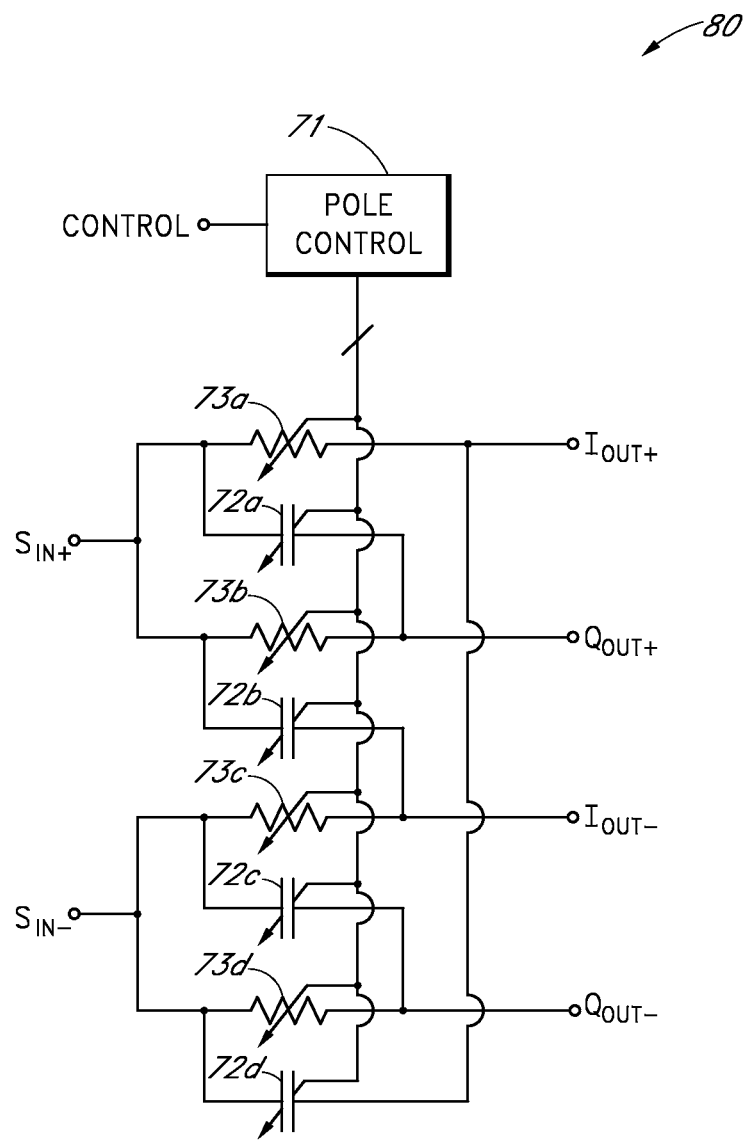
FIG. 6 is a circuit diagram illustrating another embodiment of a polyphase filter.

FIG. 6 is a circuit diagram illustrating another embodiment of a polyphase filter 80. The polyphase filter 80 includes the non-inverting and inverting clock input terminals $S_{IN+}$, $S_{IN-}$, the non-inverting and inverting in-phase clock output terminals $I_{OUT+}$, $I_{OUT-}$, the non-inverting and inverting quadrature-phase clock output terminals $Q_{OUT+}$, $Q_{OUT-}$, and a control terminal CONTROL. The polyphase filter 80 further includes first to fourth variable resistors 73a-73d, first to fourth variable capacitors 72a-72d, and a pole control block 71.

The first and second variable resistors 73a, 73b are electrically connected between the non-inverting clock input terminal $S_{IN+}$ and the non-inverting in-phase and non-inverting quadrature-phase clock output terminals $I_{OUT+}$, $Q_{OUT+}$, respectively. The third and fourth variable resistors 73c, 73d are electrically connected between the inverting clock input terminal $S_{IN-}$ and the inverting in-phase and inverting quadrature-phase clock output terminals $I_{OUT-}$, $Q_{OUT-}$, respectively. The first and second variable capacitors 72a, 72b are electrically connected between the non-inverting clock input terminal $S_{IN+}$ and the non-inverting quadrature-phase and inverting in-phase clock output terminals $Q_{OUT+}$, $I_{OUT-}$, respectively. Additionally, the third and fourth variable capacitors 72c, 72d are electrically connected between the inverting clock input terminal $S_{IN-}$ and the inverting quadrature-phase and non-inverting in-phase clock output terminals $Q_{OUT-}$, $I_{OUT+}$, respectively.

The pole control block 71 can be used to control the resistance of the first to fourth variable resistors 73a-73d and/or the capacitance of the first to fourth variable capacitors 72a-72d based on control information received on the control terminal CONTROL. The control information can include data indicative of an input signal frequency of the sinusoidal clock input signal received by the polyphase filter 80. Additionally, the pole control block 71 can select the resistances of the variable resistors and/or the capacitances of the variable capacitors so as to control a location in frequency of the polyphase filter's pole. Since the output clock signals generated by the polyphase filter 80 can have a quadrature phase relationship when the input clock signal frequency is close to the frequency of the pole of the polyphase filter 80, the pole control block 71 can be used to move or change the location of the polyphase filter's pole in relation to the input signal frequency. Thus, the illustrated polyphase filter 80 can be used in systems having need for quadrature sinusoidal reference clock signals spanning a relatively wide band of frequency, such as a band including multiple decades of frequency.

The first to fourth variable resistors 73a-73d and the first to fourth variable capacitors 72a-72d can be implemented in any suitable manner. In one embodiment, the first to fourth variable resistors 73a-73d include field-effect transistors having a channel resistance configured to change in response to a gate bias voltage. In another embodiment, the first to fourth variable capacitors 72a-72d include field-effect transistors having a gate-to-source capacitance configured to change in response to a gate bias voltage. Although one suitable implementation of the first to fourth variable resistors 73a-73d and the first to fourth variable capacitors 72a-72d has been described, other configurations can be used.

Although FIG. 6 illustrates a configuration of the polyphase filter 80 in which the frequency of the polyphase filter's pole is controlled using both variable resistors and variable capacitors, implementations using variable resistors and fixed capacitors or implementations using fixed resistors and variable capacitors can be used. Additionally, although a polyphase filter with a controllable or movable pole location has been described in the context of a type-II polyphase filter, polyphase filters including a movable pole can be implemented in a type-I polyphase filter configuration.

Figure 7A:
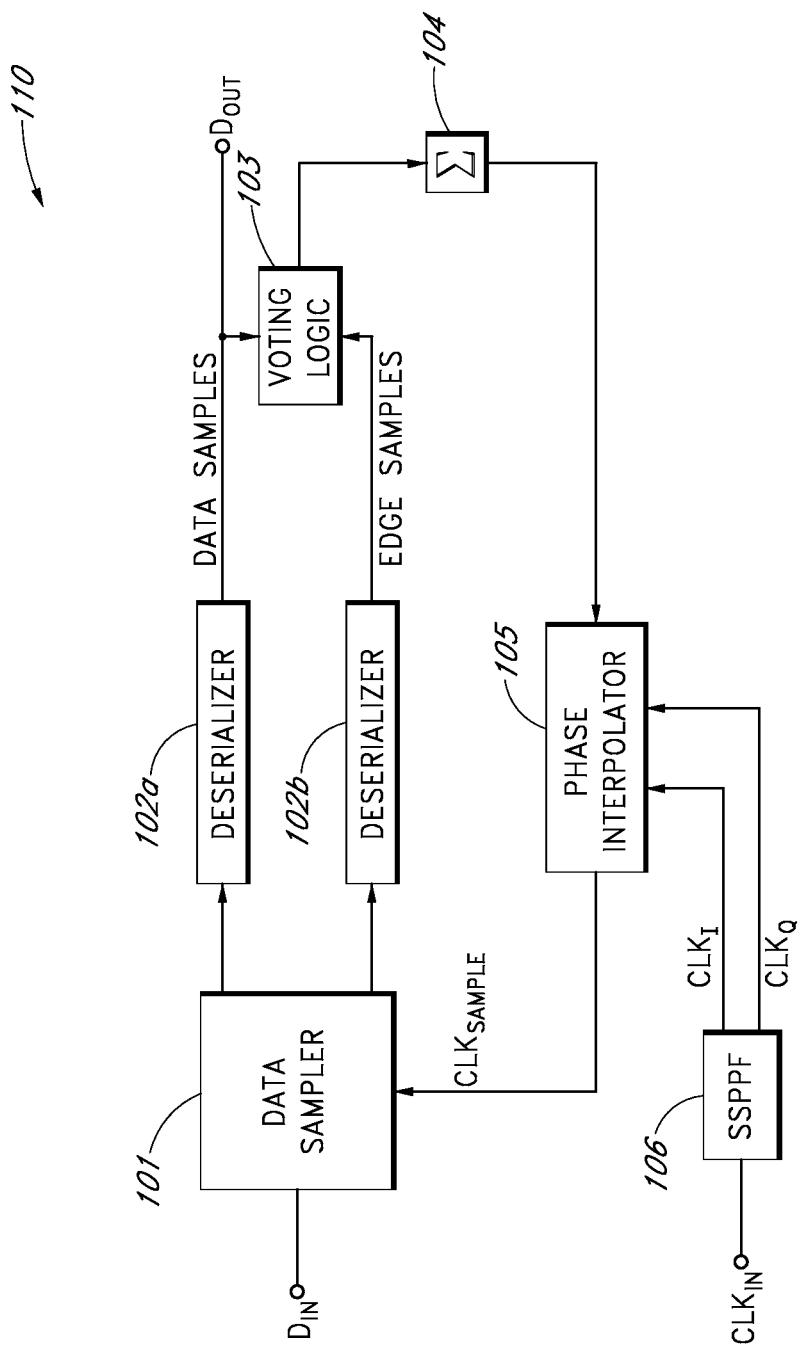
FIG. 7A is a schematic block diagram of one embodiment of a clock and data recovery (CDR) system.

FIG. 7A is a schematic block diagram of one embodiment of a CDR system 110. The CDR system 110 includes a data sampler 101, a first deserializer 102a, a second deserializer 102b, voting logic 103, an accumulator 104, a phase interpolator 105, and a quadrature clock signal generator or sine-shaping polyphase filter (SSPPF) 106. The CDR system 110 further includes a clock input terminal $CLK_{IN}$, a data input terminal $D_{IN}$, and a data output terminal $D_{OUT}$. The CDR system 110 illustrates one example of a CDR system in which the quadrature clock signal generators described herein can be used.

The sampler 101 can be used to sample a serial data stream received on the data input terminal $D_{IN}$ on edges of a sampling clock signal $CLK_{SAMPLE}$. The serial data stream can include a string of serial data bits that transition at a data rate. At a given data rate, the serial data stream has a unit interval (UI), or minimum time interval between transitions of the serial data stream. The samples taken by the sampler 101 can include not only data samples, but also edge samples of the serial data stream used to lock the CDR system 110 to the serial data stream. When the CDR system 110 is in a lock condition, the samples can be taken from specific positions into the UI of the serial data stream. A rising edge of the sampling clock signal $CLK_{SAMPLE}$ can be used to capture data samples and a falling edge of the sampling clock signal $CLK_{SAMPLE}$ can be used to capture edge samples or vice versa.

In the illustrated configuration, the sampler 101 has been configured to provide data samples to the first deserializer 102a and edge samples to the second deserializer 102b. The first and second deserializers 102a, 102b can be used to deserialize the samples captured by the data sampler 101. The first deserializer 102a is configured to provide the deserialzed data samples to the data output terminal $D_{OUT}$ and to the voting logic 103, and the second deserializer 102b is configured to provide the deserialzed edge samples to the voting logic 103. By deserializing the samples captured by the sampler 101, the first and second deserializers 102a, 102b can provide the captured samples to processing circuitry at a reduced bit rate, thereby relaxing an operating frequency design constraint of the processing circuitry. In one embodiment the first and second deserializers 102a, 102b each receive a stream of samples and the deserializers 102a, 102b deserialize the streams by a factor of 10 or more.

The voting logic 103 and the accumulator 104 can be used to control the phase interpolator 105 based on the deserialzed data and edge samples. For example, the voting logic 103 can increase or decrease a value stored in the accumulator 104 used to control a phase of the sampling clock signal $CLK_{SAMPLE}$. The voting logic 103 can be used to process timing of data transitions between the edge and data samples so as to shift the sampling clock signal $CLK_{SAMPLE}$ earlier or later in time to align the clock signal $CLK_{SAMPLE}$ relative to the unit interval of the serial data stream. In certain implementations, the accumulator 104 is a digital wrapping accumulator.

The illustrated quadrature clock signal generator or sine-shaping polyphase filter 106 has been used to generate quadrature sinusoidal reference clock signals for the CDR system 110. For example, the quadrature clock signal generator 106 is configured to receive an input clock signal on the clock input terminal $CLK_{IN}$ and to generate an in-phase sinusoidal reference clock signal $CLK_I$ and a quadrature-phase sinusoidal reference clock signal $CLK_Q$ for the phase interpolator 105. The input clock signal can be, for example, a square or rectangular wave clock signal.

The phase interpolator 105 can be used to generate the sampling clock signal $CLK_{SAMPLE}$ by interpolating the in-phase sinusoidal reference clock signal $CLK_I$ and the quadrature-phase sinusoidal reference clock signal $CLK_Q$ based on control information received from the accumulator 104.

In certain implementations, the phase interpolator 105 is implemented to generate an interpolated clock signal $CLK_{INTERP}$ based on a weighted sum of the in-phase and quadrature-phase sinusoidal reference clock signals $CLK_I$, $CLK_Q$. For example, the phase interpolator 105 can generate the interpolated clock signal $CLK_{INTERP}$ based on Equation 1 below.

$$CLK_{INTERP} = A \times CLK_I + B \times CLK_Q \qquad \text{Equation 1}$$

In Equation 1 above, the interpolated clock signal $CLK_{INTERP}$ has been generated based on weighting or multiplying the in-phase sinusoidal reference clock signal $CLK_I$ by a first factor A and the quadrature-phase sinusoidal reference clock signal $CLK_Q$ by a second factor B. By selecting the values of the first and second factors A, B a sinusoidal signal of a desired phase can be generated. For example, in a configuration in which the in-phase sinusoidal reference clock signal $CLK_I$ has a value $\cos(\omega t)$ and the quadrature-phase sinusoidal reference clock signal $CLK_Q$ has a value $\sin(\omega t)$, the interpolated clock signal $CLK_{INTERP}$ can have a value determined from Equation 2 below.

$$CLK_{INTERP} = \sqrt{A^2 + B^2} \times \cos(\omega t + \theta) \qquad \text{Equation 2}$$

In Equation 2 above, the interpolated clock signal $CLK_{INTERP}$ is a sinusoidal clock signal having an amplitude of about $$\sqrt{A^2 + B^2}$$

and a phase of θ, where θ is about equal to arctan(B/A). By controlling the magnitudes of the first and second factors A, B, a sinusoidal clock signal of a desired phase can be generated. In one embodiment, the phase interpolator 105 includes a look-up table including values of the first and second factors A, B associated with different phase shifts. Additionally, the values in the look-up table are selected such that the amplitude $$\sqrt{A^2 + B^2}$$

of the interpolated sinusoidal clock signal is approximately constant for different phase values. Although one implementation of the phase interpolator 105 has been described, other configurations can be used.

The phase interpolator 105 can generate the sampling clock signal $CLK_{SAMPLE}$ from the interpolated clock signal $CLK_{INTERP}$ in any suitable manner, such as by limiting the interpolated clock signal $CLK_{INTERP}$ to generate a square wave sampling clock signal suitable for capturing samples.

Figure 7B:
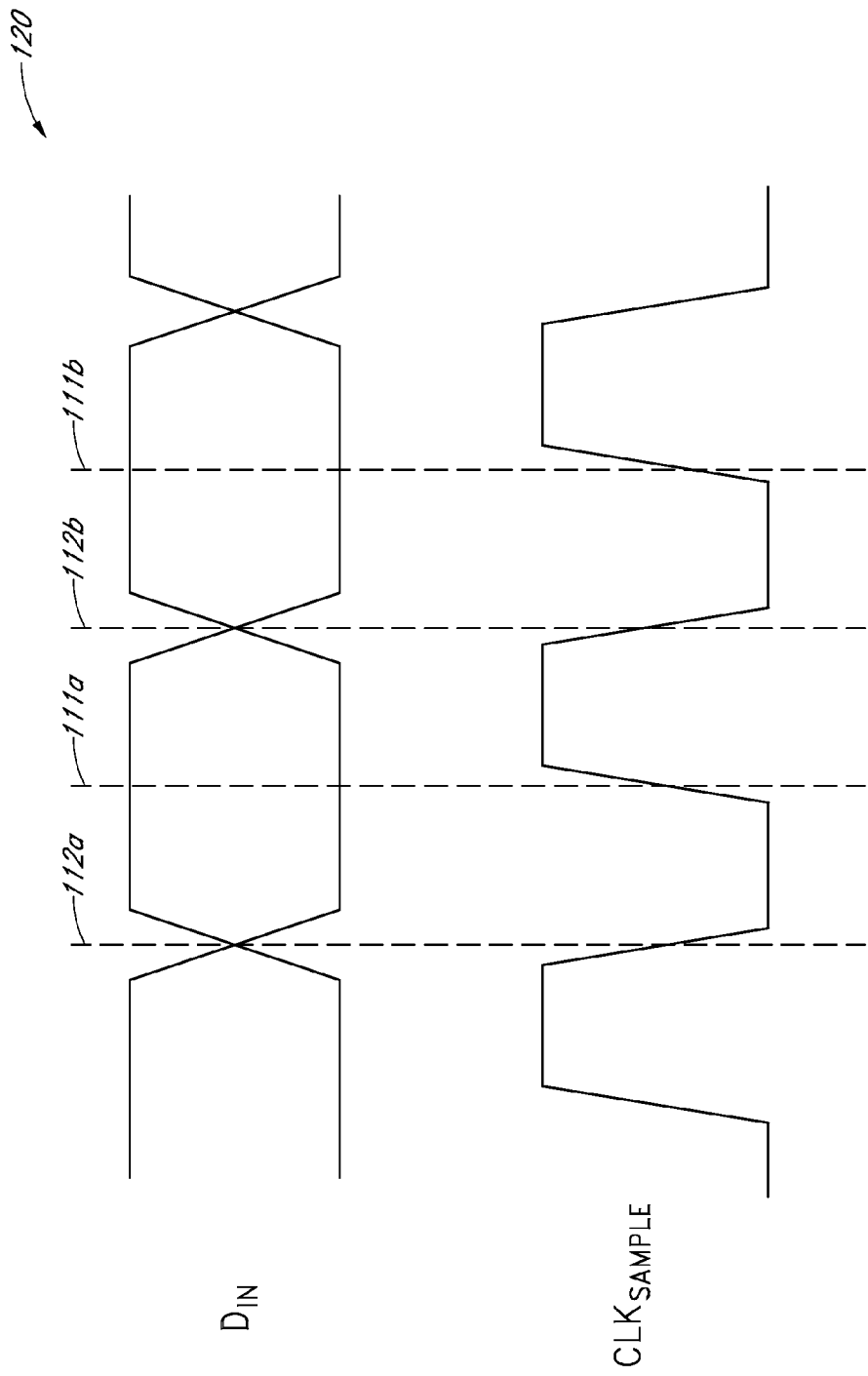
FIG. 7B is a graph illustrating one example of a timing diagram for the CDR system of FIG. 7A.

FIG. 7B is a graph illustrating one example of a timing diagram 120 for the CDR system 110 of FIG. 7A. The timing diagram 120 includes a first plot of a serial data stream received on the data input terminal $D_{IN}$ of FIG. 7A and a second plot of the sampling clock signal $CLK_{SAMPLE}$ of FIG. 7A. The timing diagram 120 has been annotated to illustrate sampling times of a first data sample 111a, a second data sample 111b, a first transition or edge sample 112a, and a second transition sample 112b. As shown in FIG. 7B, the timing diagram 120 illustrates a configuration in which the data sampling rate of the serial data stream is about equal to the frequency of the sampling clock signal $CLK_{SAMPLE}$. Thus, the timing diagram 120 illustrates timing data for a full-rate CDR system.

The timing diagram 120 illustrates a configuration in which data samples of the serial data stream are captured on rising edges of the sampling clock signal $CLK_{SAMPLE}$ and edge samples of the serial data stream are captured on falling edges of the sampling clock signal $CLK_{SAMPLE}$. However, other configurations of CDR systems can be used, such as implementations in which data samples are captured on falling edges of the sampling clock signal $CLK_{SAMPLE}$ and edge samples are captured on rising edges of the sampling clock signal $CLK_{SAMPLE}$.

Figure 8A:
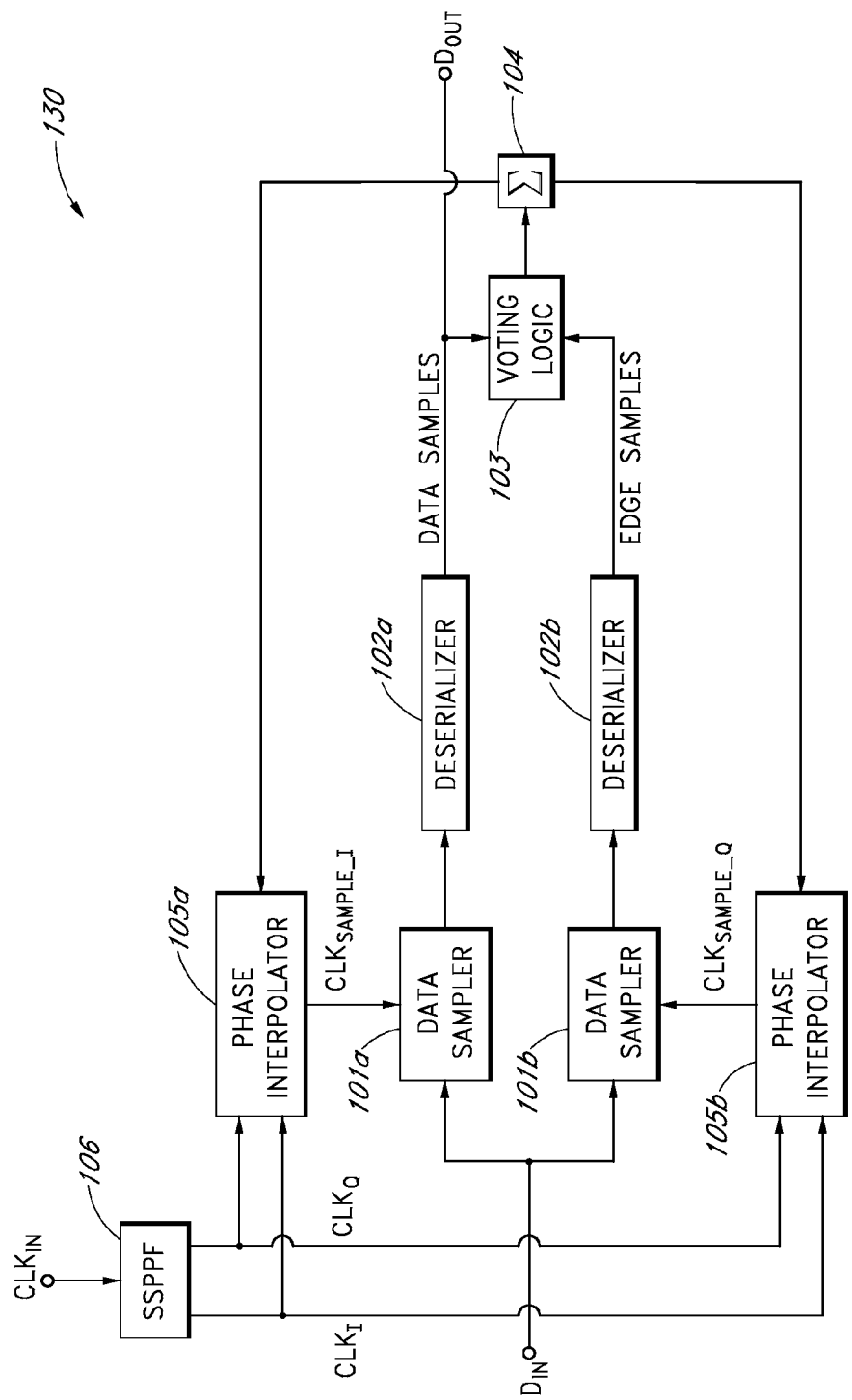
FIG. 8A is a schematic block diagram of another embodiment of a CDR system.

FIG. 8A is a schematic block diagram of another embodiment of a CDR system 130. The CDR system 130 includes first and second data samplers 101a, 101b, first and second deserializers 102a, 102b, the voting logic 103, the accumulator 104, first and second phase interpolators 105a, 105b, and the quadrature clock signal generator or SSPPF 106. The CDR system 110 further includes the clock input terminal $CLK_{IN}$, the data input terminal $D_{IN}$, and the data output terminal $D_{OUT}$.

The CDR system 130 of FIG. 8A is similar to the CDR system 110 of FIG. 7A, except that the CDR system 130 is implemented in a half-rate configuration using two samplers and two phase interpolators. For example, the first data sampler 101a is configured to sample a serial data stream received on the data input terminal $D_{IN}$ on both rising and falling edges of an in-phase sampling clock signal $CLK_{SAMPLE\_I}$ to generate data samples for the first deserializer 102a. Additionally, the second data sampler 101b is configured to sample the serial data stream on both rising and falling edges of a quadrature-phase sampling clock signal $CLK_{SAMPLE\_Q}$ to generate edge samples for the second deserializer 102b.

As illustrated in FIG. 8A, the first phase interpolator 105a has been configured to generate the in-phase sampling clock signal $CLK_{SAMPLE\_I}$ and the second phase interpolator 105b has been configured to generate the quadrature-phase sampling clock signal $CLK_{SAMPLE\_Q}$. The first and second phase interpolators 105a, 105b can be configured to generate the in-phase and quadrature-phase sampling clock signals $CLK_{SAMPLE\_I}$, $CLK_{SAMPLE\_Q}$ by interpolating the in-phase and quadrature-phase sinusoidal reference clock signals $CLK_I$, $CLK_Q$ generated by the quadrature clock signal generator 106 based on control information received from the accumulator 104. In certain implementations, the first and second phase interpolators 105a, 105b can maintain a quadrature phase relationship between the in-phase and quadrature phase sampling clock signals $CLK_{SAMPLE\_I}$, $CLK_{SAMPLE\_Q}$ and can move the sampling clock signals in lock-step.

FIG. 8B is a graph illustrating one example of a timing diagram 140 for the CDR system 130 of FIG. 8A. The timing diagram 140 includes a first plot of a serial data stream received on the data input terminal $D_{IN}$ of FIG. 8A, a second plot of the in-phase sampling clock signal $CLK_{SAMPLE\_I}$ of FIG. 8A, and a third plot of the quadrature-phase sampling clock signal $CLK_{SAMPLE\_Q}$ of FIG. 8A. The timing diagram 140 has been annotated to illustrate sampling times of a first data sample 131a, a second data sample 131b, a first edge or transition sample 132a, and a second transition sample 132b. The timing diagram 140 illustrates a configuration of a half-rate CDR system.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a sine-shaping filter configured to receive a clock input signal and to filter the clock input signal to generate a sinusoidal clock signal; and
   a polyphase filter configured to receive the sinusoidal clock signal and to generate an in-phase clock signal and a quadrature-phase clock signal based on the sinusoidal clock signal,
   wherein the in-phase clock signal and the quadrature-phase clock signal have a quadrature phase relationship,
   wherein the polyphase filter comprises a first stage including a first plurality of resistors and a first plurality of capacitors, wherein the first stage is associated with a first pole of a transfer function of the polyphase filter.

2. The apparatus of claim 1, further comprising a buffer circuit configured to buffer the in-phase clock signal to generate an in-phase sinusoidal reference clock signal and to buffer the quadrature-phase clock signal to generate a quadrature-phase sinusoidal reference clock signal, wherein the in-phase sinusoidal reference clock signal and the quadrature-phase sinusoidal reference clock signal have a quadrature phase relationship.

3. The apparatus of claim 2, further comprising a phase interpolator configured to generate an interpolated clock signal based on a weighted sum of the in-phase sinusoidal reference clock signal and the quadrature-phase sinusoidal reference clock signal.

4. The apparatus of claim 2, wherein the clock input signal is one of a square wave clock input signal or a rectangular wave clock input signal, wherein the clock input signal has a first period, and wherein the in-phase sinusoidal reference clock signal and the quadrature-phase sinusoidal reference clock signal each have a period about equal to the first period, and wherein the in-phase sinusoidal reference clock signal and the quadrature-phase sinusoidal reference clock signal have a phase difference about equal to one-quarter of the first period.

5. The apparatus of claim 2, wherein the sine-shaping filter comprises an inverter and a resistor, the inverter including an input configured to receive the clock input signal and an output configured to generate the sinusoidal clock signal, wherein the resistor is electrically connected between the input and the output of the inverter.

6. The apparatus of claim 1, wherein the first plurality of resistors comprises a first plurality of variable resistors, wherein the polyphase filter further comprises a pole control block configured to control a location in frequency of the first pole at least in part by controlling resistances associated with the first plurality of variable resistors.

7. The apparatus of claim 1, wherein the first plurality of capacitors comprises a first plurality of variable capacitors, wherein the polyphase filter further comprises a pole control block configured to control a location in frequency of the first pole at least in part by controlling capacitances associated with the first plurality of variable capacitors.

8. The apparatus of claim 1, wherein the in-phase clock signal and the quadrature-phase clock signal are configured to have about equal amplitudes when a frequency of the clock input signal is about equal to a frequency of the first pole.

9. The apparatus of claim 1, wherein the clock input signal has a first period, and wherein the in-phase clock signal and the quadrature-phase clock signal have a phase difference about equal to one-quarter of the first period when a frequency of the clock input signal is about equal to a frequency of the first pole.

10. The apparatus of claim 1, wherein the polyphase filter further comprises a second stage including a second plurality of resistors and a second plurality of capacitors, wherein the second stage is associated with a second pole of the transfer function of the polyphase filter.

11. The apparatus of claim 10, wherein the polyphase filter further comprises an inter-stage buffer circuit disposed between the first and second stages, wherein inter-stage buffer circuit is configured to buffer output signals generated by the first stage and to generate buffered signals as inputs to the second stage.

12. An apparatus, comprising:
   a sine-shaping filter configured to receive a clock input signal and to filter the clock input signal to generate a sinusoidal clock signal;
   a polyphase filter configured to receive the sinusoidal clock signal and to generate an in-phase clock signal and a quadrature-phase clock signal based on the sinusoidal clock signal, wherein the in-phase clock signal and the quadrature-phase clock signal have a quadrature phase relationship;
   a buffer circuit configured to buffer the in-phase clock signal to generate an in-phase sinusoidal reference clock signal and to buffer the quadrature-phase clock signal to generate a quadrature-phase sinusoidal reference clock signal, wherein the in-phase sinusoidal reference clock signal and the quadrature-phase sinusoidal reference clock signal have a quadrature phase relationship;
   a phase interpolator configured to generate an interpolated clock signal based on a weighted sum of the in-phase sinusoidal reference clock signal and the quadrature-phase sinusoidal reference clock signal; and
   a sampler configured to receive a serial data stream and to sample the serial data stream on at least one of a rising edge of a sampling clock signal and a falling edge of the sampling clock signal, wherein the phase interpolator is configured to generate the sampling clock signal based on the interpolated clock signal.

13. An apparatus comprising:
   a sine-shaping filter configured to receive a clock input signal and to filter the clock input signal to generate a sinusoidal clock signal;
   a polyphase filter configured to receive the sinusoidal clock signal and to generate an in-phase clock signal and a quadrature-phase clock signal based on the sinusoidal clock signal, wherein the in-phase clock signal and the quadrature-phase clock signal have a quadrature phase relationship;
   a buffer circuit configured to buffer the in-phase clock signal to generate an in-phase sinusoidal reference clock signal and to buffer the quadrature-phase clock signal to generate a quadrature-phase sinusoidal reference clock signal, wherein the in-phase sinusoidal reference clock signal and the quadrature-phase sinusoidal reference clock signal have a quadrature phase relationship; and a regulator configured to generate a regulated voltage, wherein the regulator is configured to power at least a portion of the buffer circuit using the regulated voltage.

14. An apparatus comprising:
a sine-shaping filter configured to receive a clock input signal and to filter the clock input signal to generate a sinusoidal clock signal;
a polyphase filter configured to receive the sinusoidal clock signal and to generate an in-phase clock signal and a quadrature-phase clock signal based on the sinusoidal clock signal, wherein the in-phase clock signal and the quadrature-phase clock signal have a quadrature phase relationship; and
a buffer circuit configured to buffer the in-phase clock signal to generate an in-phase sinusoidal reference clock signal and to buffer the quadrature-phase clock signal to generate a quadrature-phase sinusoidal reference clock signal, wherein the in-phase sinusoidal reference clock signal and the quadrature-phase sinusoidal reference clock signal have a quadrature phase relationship,
wherein the clock input signal, the sinusoidal clock signal, the in-phase clock signal, the quadrature-phase clock signal, the in-phase sinusoidal reference clock signal, and the quadrature-phase sinusoidal reference clock signal are differential signals.

15. The apparatus of claim 14, wherein the polyphase filter comprises a first stage including a first plurality of resistors and a first plurality of capacitors, wherein the first stage is associated with a first pole of a transfer function of the polyphase filter.

16. An apparatus comprising:
a sine-shaping filter configured to receive a clock input signal and to filter the clock input signal to generate a sinusoidal clock signal;
a polyphase filter configured to receive the sinusoidal clock signal and to generate an in-phase clock signal and a quadrature-phase clock signal based on the sinusoidal clock signal, wherein the in-phase clock signal and the quadrature-phase clock signal have a quadrature phase relationship; and
a buffer circuit configured to buffer the in-phase clock signal to generate an in-phase sinusoidal reference clock signal and to buffer the quadrature-phase clock signal to generate a quadrature-phase sinusoidal reference clock signal, wherein the in-phase sinusoidal reference clock signal and the quadrature-phase sinusoidal reference clock signal have a quadrature phase relationship,
wherein the buffer circuit comprises a first buffer inverter, a second buffer inverter, a first buffer resistor, and a second buffer resistor, and wherein the first buffer inverter includes an input configured to receive the in-phase clock signal and an output configured to generate the in-phase sinusoidal reference clock signal, and wherein the second buffer inverter includes an input configured to receive the quadrature-phase clock signal and an output configured to generate the quadrature-phase sinusoidal reference clock signal, and wherein the first buffer resistor is electrically connected between the input and the output of the first buffer inverter, and wherein the second buffer resistor is electrically connected between the input and the output of the second buffer inverter.

17. A method of clock signal generation, the method comprising:
filtering a clock input signal to generate a sinusoidal clock signal using a sine-shaping filter;
generating an in-phase clock signal and a quadrature-phase clock signal from the sinusoidal clock signal using a polyphase filter,
wherein the in-phase sinusoidal reference clock signal and the quadrature-phase sinusoidal reference clock signal have a quadrature phase relationship;
buffering the in-phase clock signal to generate an in-phase sinusoidal reference clock signal using a buffer circuit;
buffering the quadrature-phase clock signal to generate a quadrature-phase sinusoidal reference clock signal using the buffer circuit, wherein the in-phase sinusoidal reference clock signal and the quadrature-phase sinusoidal reference clock signal have a quadrature phase relationship;
generating an interpolated clock signal using a phase interpolator, wherein the interpolated clock signal is based on a weighted sum of the in-phase sinusoidal reference clock signal and the quadrature-phase sinusoidal reference clock signal; and
generating a sampling clock signal based on the interpolated clock signal and sampling a serial data stream using the sampling clock signal.

18. The method of claim 17, wherein the in-phase sinusoidal reference clock signal and the quadrature-phase sinusoidal reference clock signal have equal amplitudes.

19. A method of clock signal generation comprising:
filtering a clock input signal to generate a sinusoidal clock signal using a sine-shaping filter;
generating an in-phase clock signal and a quadrature-phase clock signal from the sinusoidal clock signal using a polyphase filter, wherein the in-phase sinusoidal reference clock signal and the quadrature-phase sinusoidal reference clock signal have a quadrature phase relationship;
buffering the in-phase clock signal to generate an in-phase sinusoidal reference clock signal using a buffer circuit; and
buffering the quadrature-phase clock signal to generate a quadrature-phase sinusoidal reference clock signal using the buffer circuit, wherein the in-phase sinusoidal reference clock signal and the quadrature-phase sinusoidal reference clock signal have a quadrature phase relationship,
generating a regulated voltage for the buffer circuit using a regulator.

20. The method of claim 19, further comprising generating an interpolated clock signal using a phase interpolator, wherein the interpolated clock signal is based on a weighted sum of the in-phase sinusoidal reference clock signal and the quadrature-phase sinusoidal reference clock signal.

21. The method of claim 20, further comprising generating a sampling clock signal based on the interpolated clock signal and sampling a serial data stream using the sampling clock signal.

* * * * *